United States Patent [19]

Hara

[11] Patent Number: 5,181,065

[45] Date of Patent: Jan. 19, 1993

[54] FLEXIBLE PRINTED BOARD FOR USE IN CAMERAS

[75] Inventor: Masaharu Hara, Kawasaki, Japan

[73] Assignee: Nikon Corporation, Tokyo, Japan

[21] Appl. No.: 750,951

[22] Filed: Aug. 28, 1991

[30] Foreign Application Priority Data

Sep. 4, 1990 [JP] Japan .................... 2-92474[U]

[51] Int. Cl.⁵ ................................................ G03B 7/00
[52] U.S. Cl. ............................................... 354/485
[58] Field of Search ........................................ 354/485

[56] References Cited

U.S. PATENT DOCUMENTS

| Re. 31,207 | 4/1983 | Tsunekawa et al. | 354/485 |
| 4,115,790 | 9/1978 | Tsunefuji | 354/485 |
| 4,227,788 | 10/1980 | Shimizu et al. | 354/485 |
| 4,615,604 | 10/1986 | Yamada | 354/485 |
| 4,681,421 | 7/1987 | Yamada et al. | 354/485 |
| 4,711,548 | 12/1987 | Arakawa et al. | 354/485 |
| 4,942,380 | 7/1990 | Bradford et al. | 335/301 |

Primary Examiner—Russell E. Adams
Attorney, Agent, or Firm—Shapiro and Shapiro

[57] ABSTRACT

The present invention has designed and constructed a flexible printed circuit board which has a surface portion on which is mounted an electronic component and also a board portion which is folded back over itself so as to overhang the electronic component mounting surface and in which a shield pattern is extended over at least a surface portion in opposing relationship with an electronic component and is electrically grounded in order to protect the electronic component from external electrical noise. Thus the present invention provides a flexible printed circuit board which is inexpensive to fabricate, can prevent the erroneous operation of the electronic component from external electrical noise and permits the efficient arrangement of electronic components.

13 Claims, 4 Drawing Sheets

FLEXIBLE PRINTED BOARD FOR USE IN CAMERAS

BACKGROUND OF THE INVENTION

1. Field of the Invention

The present invention relates to a flexible printed circuit board with shield patterns for use in cameras.

2. Related Background Art

Of the conventional flexible printed boards for use in cameras, there has been proposed a construction in which an exposed conductor is folded back itself, thereby effecting an electrical isolation.

In case of the electrical control of the operation of a camera, in order to prevent erroneous operations of a camera due to external electrical noise, there has been proposed to plate the back surface of a component having plastic outer surfaces with a metal or to attach a special designed shield sheet to the back surface thereof. However, the above-described techniques have the following problems.

First, in the case of the construction in which the folded back portions are provided to attain electrical isolation, there has been no idea to prevent the erroneous operations of a camera from external electronical noise.

When the back surface of a component having a plastic outer surfaces is plated with a metal in order to prevent erroneous operations of a camera due to external electrical noise, the cost of the component is increased and the further increase in cost results when means for electrically isolate the metal plated surface from other electronic components is employed.

Furthermore, when a specially-designed shield sheet is used, the cost of each component is also increased and means for grounding is further required. As a result, the components are increased in cost and the number of assembly steps is increased.

Moreover, the electric circuits for cameras have been increased in size in the recent years so that the space in which the components which must be electrically shielded are installed must be secured and then the requirement for efficient arrangement of these components is increased.

SUMMARY OF THE INVENTION

The present invention was made to overcome the above and other problems encountered in the conventional flexible printed circuit boards for use in cameras and has for its object to provide not only a flexible printed circuit board which is low in cost and can positively prevent erroneous operations of a camera but also a flexible printed circuit board in which the components of an electronic circuit board can be efficiently arranged.

According to the present invention, in order to overcome the above-described problems, a flexible printed circuit board is designed and constructed in such manner that a first portion on which is mounted an electronic component and a second portion which is folded back itself so to overhang the first portion are defined and a shield pattern is extended over at least a portion in opposing relationship with electronic component and is electrically grounded in order to protect the electronic component from external electrical noise.

Furthermore, the present invention designed and constructed a flexible printed circuit board in which a shield pattern is extended over the outer surface of a folded-back portion in opposing relationship with the inner surface over which are disposed electronic components except the first mentioned electronic component.

Moreover, the present invention designed and constructed a flexible printed circuit board upon which are mounted the former electronic component and the latter electronic component in such a way that when the flexible printed circuit board is folded back itself, both the electronic components are prevented from overlapping each other with the space defined by the portion which is not folded back and the folded-back portion so as to overhang the surface not folded back.

There exists a folded-back portion in opposing relationship with the portion which is not folded back and on which are mounted one or more electronic components and one or more shield patterns are extended over at least one surface of the folded-back board portion, thereby protecting the electronic components from external electrical noise.

It is possible to arrange one or more electronic components on the folded-back board portion. In this case, a shield pattern extended over the outer side of the folded-back portion protects the electronic components from external electrical noise.

A shield pattern is extended over the folded-back portion in opposing relationship with the board portion which is not folded back and on which are mounted one or more electronic components and is electrically grounded so that the operation of the electronic components can be prevented from being adversely affected by external electrical noise.

One or more shield pattern are extended over one or both surfaces of the folded back board portion overhanging the electronic components and are electrically grounded so as to protect the electronic components from external electrical noise so that it is not needed any more to increase the number of components for shielding the electronic components and one or more shield patterns can be disposed over the flexible printed circuit board at less cost so that the number of assembly steps can be minimizes and consequently the costs of the flexible printed circuit boards in accordance with the present invention can be decreased.

It is also possible to mount one or more electronic components on the folded-back board portion. In this case, one or more shield patterns are extended over the outer surface of the folded-back board portion so that the freedom of the design of the electronic circuits is increased. In addition, since one or more shield patterns can be easily provided so that the packaging density can be increased.

One or more electronic components can be mounted on both the inner surfaces of the board portion not folded-back and the board portion folded back so as to overhang the board portion not folded back. In this case, one or more shield patterns are extended over the outer surface of the folded-back board portion so that the thickness of the electronic components mounted with a high degree of packaging density can be decreased.

DETAILED DESCRIPTION OF THE PREFERRED EMBODIMENTS

Now the present invention will become more apparent from the following description of a preferred embodiment thereof taken in conjunction with the accompanying drawings.

Figure 3:
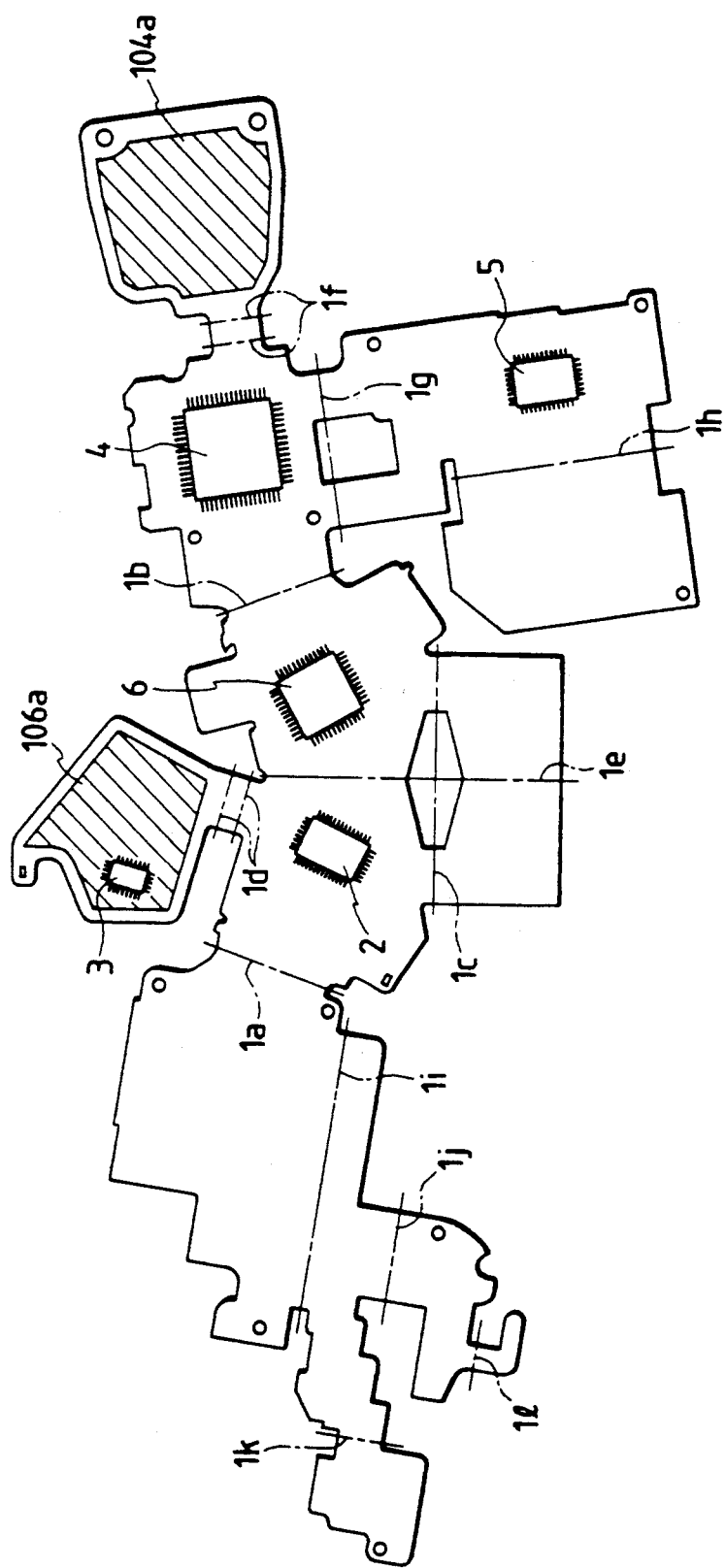
FIG. 3 is a flatly developed view thereof.

A flexible printed circuit board 1 is in the form of a plane as shown in FIG. 3 when it is developed. An electronic circuit is defined over the surface of the board 1 and integrated circuit components 2, 3, 4, 5 and 6 in addition to other electronic components (not shown) are mounted on the board 1.

Figure 1:
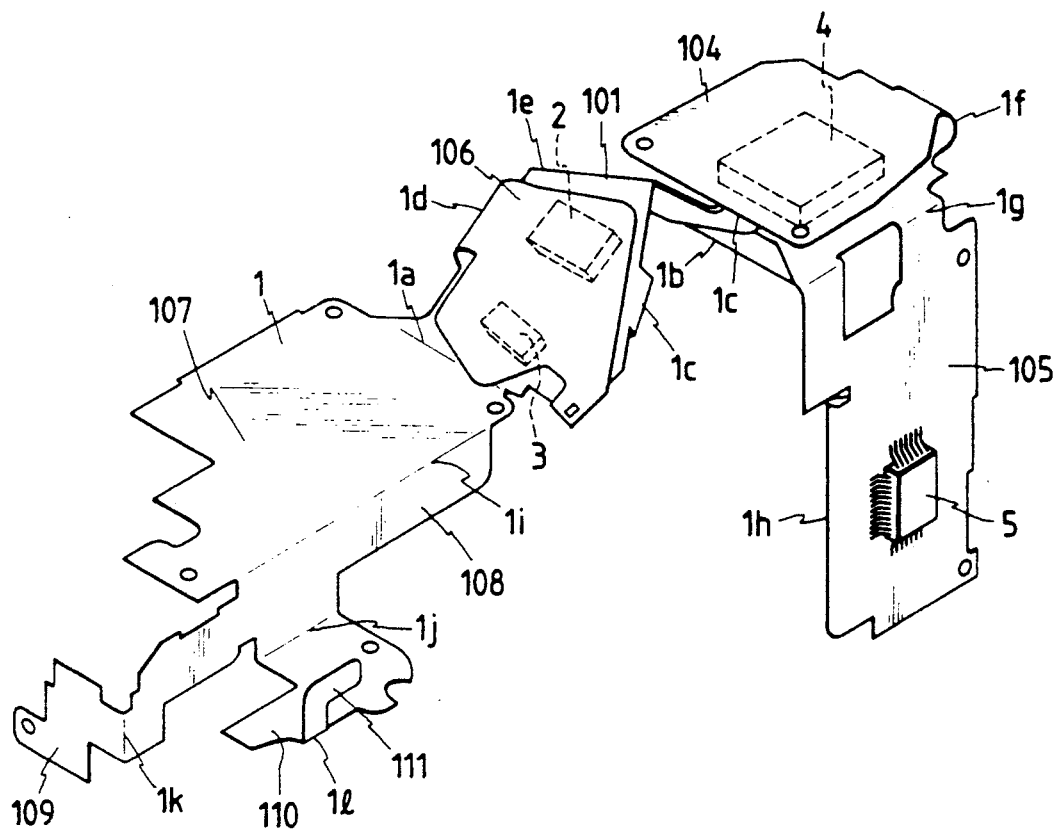
FIG. 1 is a perspective view of a three-dimensional flexible printed circuit board in accordance with the present invention which is incorporated in a camera when viewed from the front side thereof.

The printed circuit board 1 is bent at 1a, 1b, 1c. 1d, 1e, 1f, 1g, 1h, 1i, 1j, 1k and 1l to define a three dimensional shape as shown in FIG. 1 and is mounted on a camera body (not shown) from the upper portion to the front portion thereof in very intimate contact therewith like is coating.

The flexible printed circuit board 1 is divided into various portions by bending in the manner described above. More specifically, they are a winding-side upper surface portion 101 and a rewinding-side upper surface portion 102 of a pentagonal portion, an upper surface 103 on the side of the rewinding portion, a folded-back-portion-surface 104, a rewinding-side front surface 105, an upper surface folded back surface 106 on the side of rewinding of the pentagonal portion, a winding-side upper surface 107, a winding-side side surface 109, a clip upper surface 110 and a grip-side-surface 111.

Figure 2:
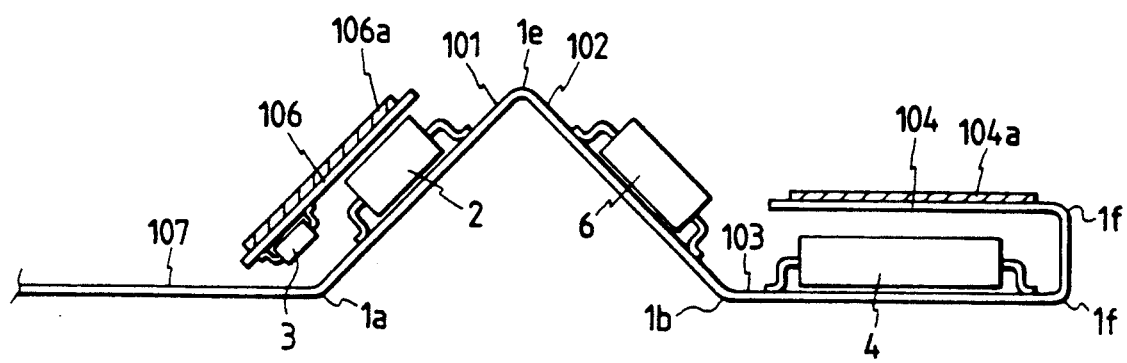
FIG. 2 is a sectional view thereof.

For the sake of easy understanding, "a folded-back portion" throughout the specification is defined as a portion which is once bent uprightly along a bending line and then folded back it self along another bending line in opposing relationship of the upper surface of a portion continuous with the folded-back portion so as to overhang it in such a way that the inner surface of the folded-back portion is spaced apart from the upper surface of the portion not folded back by a predetermined distance. In other words, a predetermined portion of the board is so folded back that the folded back portion and the portion continuous therewith and not folded back defines a U-shaped space, for example, as best shown in FIG. 2.

Next the folded-back portion 104 and the rewinding-side-upper portion 103 in opposing relationship with the surface 103 will be described.

The surface 103 is extended over the upper surface of the rewinding portion (not shown) in very intimate contact therewith. The rewinding-side-upper-folded back portion 104 folded back along the folding back portions 1f overhangs the winding-side upper surface 103.

The integrated circuit component 4 is mounted through a shield pattern 104a on the folded-back portion 104. In this embodiment, in order to protect the integrated-circuit component 4 from adverse effects due to external electrical noise, the shield pattern 104a is electrically grounded and is mounted on the inside of the folded-back portion.

Figure 4A:
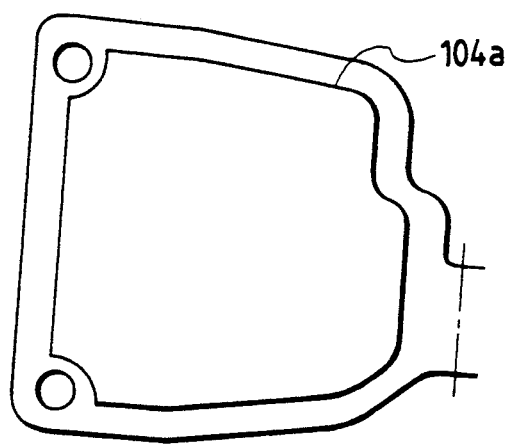
FIG. 4A is a view, partially on an enlarged scale, illustrating an example of a shield pattern.

FIG. 4A illustrates the shield patterns 104a in accordance with the present invention. FIG. 4A is a view, on an enlarged scale, of the rear surface of the folded-back portion 104 on the rewinding side upper surface when viewed from the back in FIG. 3 and illustrates the outer side of the folded-back portion 104. As shown, the shield pattern 104a is extended uniformly extended over the folded-back surface of the rewinding-side upper surface and is electrically grounded.

Figure 4B:
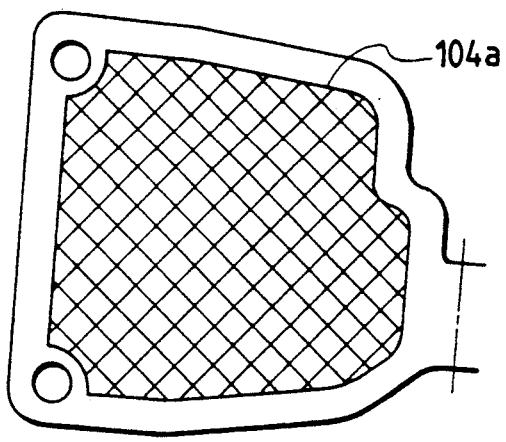
FIG. 4B is a view, partially on an enlarged scale, illustrating a modification of the shield pattern shown in FIG. 4A.
Figure 4C:
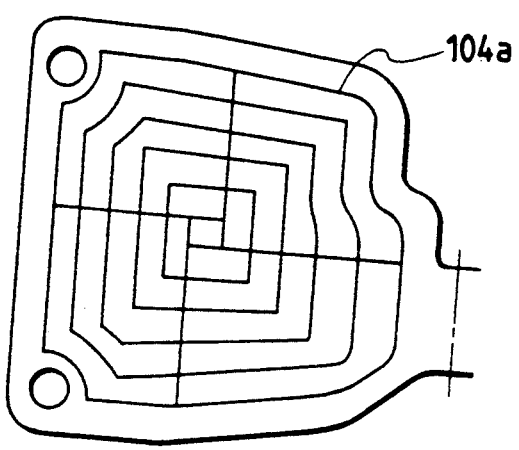
FIG. 4C is a view, partially on an enlarged scale, illustrating another modification of the shield pattern shown in FIG. 4A.

FIGS. 4B and 4C illustrate two modifications, respectively, of the shield pattern 104a shown in FIG. 4A. FIG. 4B shows a modified shield pattern 104a in the form of a net which is extended uniformly over the folded-back outer side surface and is electrically grounded. FIG. 4C illustrates a second modification of the shield pattern 104a which consists of a plurality of shield pattern segments disposed on the folded-back outer side surface of the portion 104 in the form of a plurality of segments, interconnected with each other and electrically grounded.

As described above, the shield pattern 104a may be extended over the inner surface of the folded-back portion 104 of the side upper surface of the shield patterns 104a can be disposed on both of the inner and outer surfaces of the folded-back portion of the side upper surface.

When the shield pattern 104a is at least greater in area than the integrated electric circuit component 4, it is not needed to extend the shield pattern 104a over the whole folded-back surface of the rewinding side upper surface.

Next the folded-back portion 106 of the upper surface on the rewinding side of the pentagonal portion and the upper surface 101 on the winding side of the pentagonal portion which is in opposing relationship with the portion 106 will be described.

The upper surface 101 is extended over the upper surface of the rewinding portion of a pentagonal prism (not shown) and is made into very intimate contact therewith. The portion 106 is folded back itself along the bent portion 1d so as to overhang above the surface 101.

Between the upper surface 101 and the folded-back portion 106 are disposed the integrated circuit components 2 and 3 in such a way that they are prevented to overlap each other when the folded-back portion 106 is folded back. The shield pattern 106a is extended over the outer surface of the folded-back portion 106 and is electrically grounded in order to prevent the operation of the integrated electronic circuit components 2 and 3 from being adversely affected by external electric noise. As in the case of the shield pattern 104a, the shield pattern 106a can be extended over the outer surface of the folded-back portion 106 of the winding side of the pentagonal portion in the form of a net or in the form of a plurality of segments which are electrically interconnected with each other and grounded.

Figure 5:
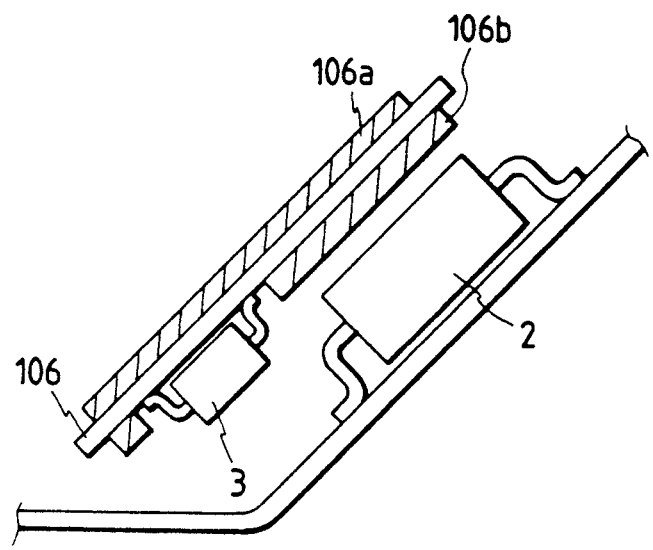
FIG. 5 is a sectional view, partially on an enlarged scale, illustrating a modification of a portion different from the portion shown in FIG. 4A of a flexible printed circuit board in accordance with the present invention.
Figure 6:
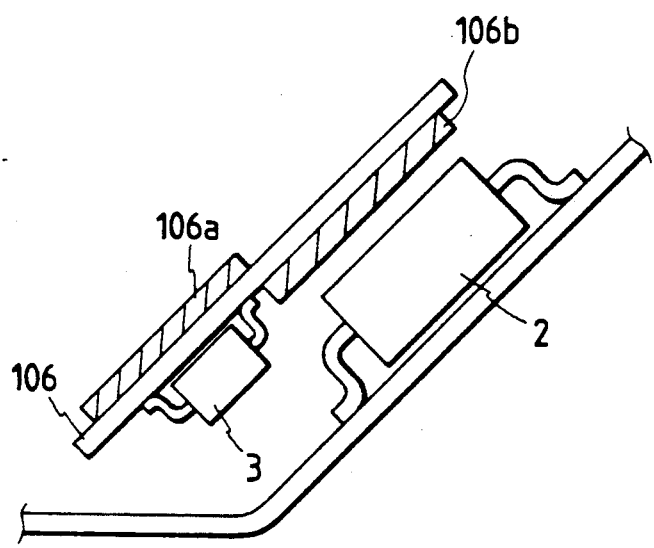
FIG. 6 is a sectional view, partially on an enlarged scale, illustrating another modification of a portion different from the portion shown in FIG. 4A of a flexible printed circuit board in accordance with the present invention.

As described above, the shield pattern 106a can be extended only over one surface of the folded-back portion 106 or the shield patterns 106a can be extended over the both the surfaces thereof. FIGS. 5 and 6 illustrate two modifications, respectively, of the shield patterns 106a which are extended over the both surfaces of the folded-back portion 106.

FIG. 5 shows a first modification of extending the shield patterns 106a extended over both the surfaces of the folded-back portion 106. More particularly, one shield pattern 106a is extended over the outer surface of the folded-back portion 106 and another shield pattern 106a is extended over the inner surface thereof except the portion upon which is mounted the integrated circuit component 3.

In the case of a second modification shown in FIG. 6, two shield patterns 106a are extended over both the surfaces of the folded-back portion 106. More particularly, one shield pattern is not extended over the whole outer surface of the folded-back portion 106, but is extended over an area thereof greater than the portion of the inner surface thereof upon which is mounted the integrated circuit component 3. Another shield pattern 106a is extended over the inner surface of the folded-back portion 106 except the area corresponding to the outer surface which is not covered by the first shield pattern 106a and which is greater than the portion upon which the integrated circuit component 2 is mounted. As shown in FIG. 6, when the electronic circuit components and the shield patterns are disposed, they can be arranged in an efficient manner.

What is claimed is:

1. A flexible printed circuit board for use in cameras comprising:
   a component mounting portion on which are mounted one or more electronic components;
   a folded-back portion which is folded back so as to overhang said component mounting portion; and
   one or more shield patterns extended over at least the inner surface of said folded-back portion in opposing relationship with said one or more electronic components and electrically grounded in order to prevent said one or more electronic components from being adversely affected by external electrical noise.

2. A flexible printed circuit board for use in cameras comprising:
   a component mounting portion on which are mounted one or more electronic components;
   a folded-back portion which is folded back so as to overhang said component mounting portion; and
   one or more shield patterns extended over at least the outer surface of said folded-back portion in opposing relationship with said one or more electronic components and electrically grounded in order to prevent said one or more electrical components from being adversely affected by external electrical noise.

3. A flexible printed circuit board as set forth in claim 1, wherein said one or more shield patterns are extended over the outer surface of said folded-back board portion and are electrically grounded.

4. A flexible printed circuit board as set forth in claim 2, wherein one or more electronic components except said one or more electronic components are mounted on the inner surface of said folded-back board portion.

5. A flexible printed circuit board as set forth in claim 4, wherein said one or more shield patterns are extended over the inner surface except the portions upon which said one or more electronic components are mounted and are electrically grounded.

6. A flexible printed circuit board as set forth in claim 4, wherein said former electronic components and said latter electronic components are mounted in such a way that when said folded-back surface portion is folded back itself, they will not interfere each other on the inner surface of said folded-back board portion.

7. A flexible printed circuit board as set forth in claim 6, wherein said one or more shield patterns are extended over the inner surface of said folded-back board portion except the portions where said one or more electronic components are mounted and are electrically grounded.

8. A flexible printed circuit board as set forth in claim 1, wherein said one or more shield patterns are extended over at least one outer portion of said folded-back board portion under which said one or more electronic components are mounted or at least one inner portion of said folded-back board portion all of which is in opposing relationship with said one or more electronic components.

9. A flexible printed circuit board as set forth in claim 1, wherein said one or more shield patterns are in the form of a net and are extended over the outer or inner surface portion thereof in opposing relationship with said one or more electronic components and are electrically grounded.

10. A flexible printed circuit board as set forth in claim 1, wherein said one or more shield patterns are in the form of a combination of a plurality of segments which are so arranged that at least one outer segment surrounds the innermost segment and is electrically connected thereto and are extended over the outer or inner surface portions which are in opposing relationship with said one or more electronic components.

11. A flexible printed circuit board as set forth in claim 2, said one or more shield patterns are extended over said outer or inner surface of said folded-back board portion at least one or more portions thereof which are in opposing relationship with said one or more electronic components and are electrically grounded.

12. A flexible printed circuit board as set forth in claim 2, wherein said one or more shield patterns are in the form of a net, are extended over said outer or inner surface of said folded-back board portion at least one or more portions thereof which are in opposing relationship with said one or more electronic components and are electrically grounded.

13. A flexible printed circuit board as set forth in claim 2, wherein each of said one or more shield patterns consists of a plurality of segments which are so arranged that at least one segment surrounds the innermost segment and is electrically connected thereto and is extended over said outer or inner surface of said folded-back board portion in opposing relationship with said one or more electronic components.

* * * * *